(12) United States Patent
Lih et al.

(10) Patent No.: US 11,333,711 B2
(45) Date of Patent: May 17, 2022

(54) METHOD FOR RAPIDLY ESTIMATING FOR REMAINING CAPACITY OF A BATTERY

(71) Applicant: National Chung-Shan Institute of Science and Technology, Taoyuan (TW)

(72) Inventors: Wen-Chen Lih, Taoyuan (TW); Tsung-Yu Tsai, Taoyuan (TW); Shih-Chang Tseng, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 264 days.

(21) Appl. No.: 16/746,922

(22) Filed: Jan. 19, 2020

(65) Prior Publication Data
US 2021/0223323 A1    Jul. 22, 2021

(51) Int. Cl.
*G01R 31/3835* (2019.01)
*H02J 7/00* (2006.01)
*G01R 31/374* (2019.01)

(52) U.S. Cl.
CPC ....... *G01R 31/3835* (2019.01); *G01R 31/374* (2019.01); *H02J 7/0048* (2020.01)

(58) Field of Classification Search
CPC .............. G01R 31/3835; G01R 31/374; G01R 31/388; H02J 7/0048
See application file for complete search history.

(56) References Cited

U.S. PATENT DOCUMENTS

| | | | | |
|---|---|---|---|---|
| 2014/0149058 | A1* | 5/2014 | Moh | G01R 31/3842 702/63 |
| 2015/0112527 | A1* | 4/2015 | Zhang | B60L 58/12 701/22 |
| 2015/0377971 | A1* | 12/2015 | Keating | H02J 7/0047 307/130 |
| 2017/0003352 | A1* | 1/2017 | Barre | G01R 31/007 |
| 2019/0178943 | A1 | 6/2019 | Lih | |
| 2020/0371162 | A1* | 11/2020 | Ruan | G01R 31/388 |
| 2021/0194261 | A1* | 6/2021 | Chen | G01R 31/3842 |
| 2021/0367435 | A1* | 11/2021 | Furui | H02J 7/0042 |

FOREIGN PATENT DOCUMENTS

| | | |
|---|---|---|
| JP | 2013-148452 A | 8/2013 |
| TW | 201821822 A | 6/2018 |

* cited by examiner

Primary Examiner — Nha T Nguyen
(74) Attorney, Agent, or Firm — Winston Hsu

(57) ABSTRACT

The present invention discloses a method for rapidly estimating for a remaining capacity of a battery, comprising performing a constant current charge to the battery in a first period, instantly capturing a voltage/temperature of the battery in a frequency, and generating a voltage-time graph; after leaving the battery along for a second period, instantly capturing the voltage/temperature of the battery in the frequency; calculating a voltage rising rate during the first period; calculating a voltage drop rate during a leaving-along period; calculating a critical sample time; applying the critical sample time, and comparing the voltage-time graph measured in the first period, to obtain a critical sampling voltage; calculating a voltage difference slope; calculating a charging time, which is consumed by charging the battery from a lower-bound voltage to an upper-bound voltage with the constant current; calculating a compensation ratio value; and calculating the remaining capacity of the battery.

6 Claims, 3 Drawing Sheets

| # | Capacity_estimate (Ah) A | Capacity_true (Ah) B | Error (%) ((B-A)/B)*100% |
|---|---|---|---|
| 1 | 87.2426 | 87.1100 | -0.15% |
| 2 | 88.0804 | 86.7232 | -1.56% |
| 3 | 85.6543 | 86.1725 | 0.60% |
| 4 | 86.5988 | 85.8907 | -0.82% |
| 5 | 83.4934 | 85.2798 | 2.09% |
| 6 | 83.6521 | 84.9446 | 1.52% |
| 7 | 84.3255 | 84.7719 | 0.53% |
| 8 | 83.9241 | 84.4567 | 0.63% |
| 9 | 82.5968 | 84.0372 | 1.71% |
| 10 | 83.0383 | 83.7718 | 0.88% |
| 11 | 82.5617 | 83.6656 | 1.32% |
| 12 | 83.2055 | 83.2549 | 0.06% |
| 13 | 82.5364 | 82.8800 | 0.41% |
| 14 | 82.3880 | 82.5368 | 0.18% |
| 15 | 82.0402 | 82.2334 | 0.23% |
| 16 | 81.5728 | 81.8416 | 0.33% |
| 17 | 81.9484 | 81.6144 | -0.41% |
| 18 | 81.1975 | 81.1267 | -0.09% |
| 19 | 81.1240 | 80.8590 | -0.33% |

FIG. 3

METHOD FOR RAPIDLY ESTIMATING FOR REMAINING CAPACITY OF A BATTERY

BACKGROUND OF THE INVENTION

1. Field of the Invention

The present invention relates to a testing technology for battery, and more particularly, to a method for rapidly estimating for a remaining capacity of a battery.

2. Description of the Prior Art

With the gradual depletion of petrochemical energy and the continuous improvement of power battery technology, people are paying more and more attention to issues such as energy conservation, carbon reduction, green energy, and environmental sustainability on facing the destruction of the ecological environment and extreme climate changing. The market share of electric vehicles, such as electric bus, electric car, and electric motorcycle, is rising due to the support of many governments worldwide. It is, thus, expected that the electric vehicle will become mature and popular in a few years. The power battery will become the main power source for the driving of electric vehicles and electricity, etc. However, these power batteries will gradually age and degrade with the usage time. There are many causes, which are observable indicators such as the reduction of remaining capacity of the battery and the battery Internal impedance increases, to the aging and degradation of batteries in the prior art.

In the prior art, as to a power battery pack of an electric vehicle, when the remaining capacity of the battery pack is less than 70%-80% of the nominal capacity of the battery pack leaving the factory, the prior art determines that the battery pack is not suitable for the electric vehicle, and the requirements of practical applications and security may not meet anymore. Therefore, the electric vehicle vendor and other related applications expect a method for estimating a status of aging and degrading and the performance of the battery, which are used to be the basis that the battery may be phased out and adapted for another purpose. After the processes such as battery classification, screening, matching, and reorganization mentioned above, for example, the degraded batteries can be used in energy storage systems to achieve the advantages of extending the battery's full life cycle, improving use efficiency, and reducing initial purchase costs. In addition, how to quickly and accurately evaluate the remaining capacity of the used electric vehicle battery will also be a bottleneck to the used electric vehicle trading market due to the increasing number of electric vehicles in the future. Therefore, the present invention discloses a method for rapidly estimating for a remaining capacity of a battery, which will be an excellent reference for evaluating the remaining capacity of the battery in the future U.S. Patent Publication No. 2007/0252600 (Diagnosis method for state-of-health of batteries) discloses a method for diagnosing the state of health of the battery (SoH), which uses a constant current to discharge a battery for a long time, and measures the battery's voltage and voltage changing rate to evaluate the health of the battery. Therefore, US Pub. 2007/0252600 cannot meet the urgent need to rapidly diagnose the remaining capacity of a battery. U.S. Patent Publication No. 2009/0128097 (Method and system for tracking battery state of health) also discloses a method for determining the state of health of a battery; that is, calculating the battery charge via the charging period and the discharging period and comparing or analyzing with the pre-set capacity of the battery. Similarly, US Pub. 2009/0128097 cannot meet the urgent need to rapidly diagnose the remaining capacity of a battery due to the long diagnosing time. U.S. Pat. No. 6,281,683 (Rapid determination of present and potential battery capacity) also discloses a method using a plurality of discharge current pulses and a plurality of leaving-along periods, and then measuring the battery voltage during the pulse current period and the battery open-circuit voltage (Voc) during the leaving-along period respectively, and calculating the voltage difference between each pulse by lookup table or equations to measure the remaining capacity and the maximum charging capacity of the battery. However, the state of the battery during the battery test was not taken into consideration; moreover, the realistic open-circuit voltage of the battery cannot be accurately measured, causing the estimation errors, because the leaving-along period is too short. TW Patent Application No. 098127249 also discloses a method with establishing a controlled discharge path inside the battery module. The battery discharge current is a constant value despite the variation of system loading current. The internal resistance measurement, which is made by establishing this constant battery current, can be the base of the relation between the pre-set internal resistance and capacity, and to the estimation for the capacity of the battery by looking up the table. The method merely takes the discharging status of the battery instead of aging and degrading and other conditions into consideration. It thus would cause the uncertainty of the discharge voltage measurement. Besides, the realistic open-circuit voltage of the battery cannot be accurately measured in a short time, which causes the calculation errors to the internal resistance. Therefore, the methods and devices in the prior art for diagnosing the status of the battery and its application have limitations and shortcomings, comprising: measuring accurately the remaining capacity of the battery during a whole of charging and discharging period taking a long time to diagnose, which cannot obtain the status of battery instantly.

In traditional battery remaining capacity (RC) estimation methods, the remaining capacity of the battery is estimated by increasing or decreasing the initial battery remaining capacity value, wherein the initial remaining capacity of the battery is determined according to the open-circuit voltage and read from the lookup table. Besides, the degree of increase (or decrease) in the remaining capacity of the battery is obtained by (Coulomb) counting the charges entering or leaving the battery. Specifically, batteries typically have specific voltage-capacity characteristics. In the lookup table, the remaining capacity of the battery is corresponding to the reference voltage by charging the battery, which has been completely discharged, till the open-circuit voltage reaching the reference voltage and counting the charge entering to the battery during charging. Thus, the counted Coulomb charge is corresponding to the remaining capacity of the battery at the reference voltage. However, due to the accumulated error of the Coulomb counting, the lookup table is not accurate. Besides, when the battery is completely discharged, the battery has a residual capacity (RES), which changes with the battery's voltage, current, temperature, etc., reducing the accuracy in the estimation process.

SUMMARY OF THE INVENTION

It is therefore a primary objective of the present invention to provide a method for rapidly estimating for a remaining capacity of a battery, which could fast and accurately calculate the remaining capacity of the battery under test, which can be the basis of battery lifetime estimation and battery usage analysis.

The present invention discloses a method for rapidly estimating for a remaining capacity of a battery, comprising performing a constant current charge to the battery under test in a first period, instantly capturing a voltage and a temperature of a positive electrode of the battery under test in a default frequency, and generating a voltage-time graph; after leaving the battery under test along for a second period, and instantly capturing the voltage and the temperature of the positive electrode of the battery under test in the default frequency; calculating a voltage rising rate of the battery under test during a constant current charging period; calculating a voltage drop rate of the battery under test during a leaving-along period; calculating a critical sample time; applying the critical sample time, and comparing the voltage-time graph measured in the constant current charging period, to obtain a critical sampling voltage; calculating a voltage difference slope of the battery under test; calculating a charging time, which is consumed by charging the battery under test from a lower bound voltage to an upper bound voltage with the constant current; calculating a compensation ratio value on the remaining capacity of the battery under test; and calculating the remaining capacity of the battery under test.

In an embodiment of the present invention, the first period is 180-240 seconds.

In an embodiment of the present invention, the second period is 30-60 seconds.

In an embodiment of the present invention, the default frequency ≥1 Hz.

In an embodiment of the present invention, the battery under test in an environmental temperature is in a safe temperature of the battery under test.

In an embodiment of the present invention, the constant current for charging is 0.2 C-2 C.

In order to make the objects, technical solutions and advantages of the present invention become more apparent, the following relies on the accompanying drawings and embodiments to describe the present invention in further detail.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a table of measurement result of a method for rapidly estimating for a remaining capacity of the battery according to 19 embodiments of the present invention.

DETAILED DESCRIPTION

The embodiments stated below are utilized for illustrating the concept of the present application. Those skilled in the art can readily understand the advantages and effects of the present invention disclosed by the application.

In the prior art, a remaining capacity of a battery is an important basis for evaluating whether the battery is sustainable and safe to use, the remaining worth and the health of the battery. Particularly, with the periodic performance test, the battery may be phased out and adapted for another purpose, and such requirements will become more specific. Therefore, considering the current environment and working conditions, to fast and accurately evaluate the remaining capacity of the battery would make the key progression in battery, electric vehicle, energy storage system, and other related applications.

However, the fair comparison to an accuracy of the evaluating results should be made under the same standard testing condition. However, the testing department cannot ask the customer to return the battery to diagnose under a specific condition. In other words, the testing department may receive the batteries with a variant environmental temperature, a variant battery temperature, and a variant State-of-Charge (SoC), which are different from the standard testing conditions mentioned above. Therefore, the remaining capacity of the battery is defined in a standard testing environment of the present invention, wherein the standard testing environment is defined by an environmental temperature of 25±3° C., a constant current ratio of 1.0 C, and an initial testing voltage of the lower bound voltage ($V_{LL}$) of the battery under test. The evaluating results of the battery of which State-of-Charge is less than 50% in every application under these conditions may be corresponding to the remaining capacity of the battery in the standard testing environment by the method of the present invention to fairly compare.

Figure 1:
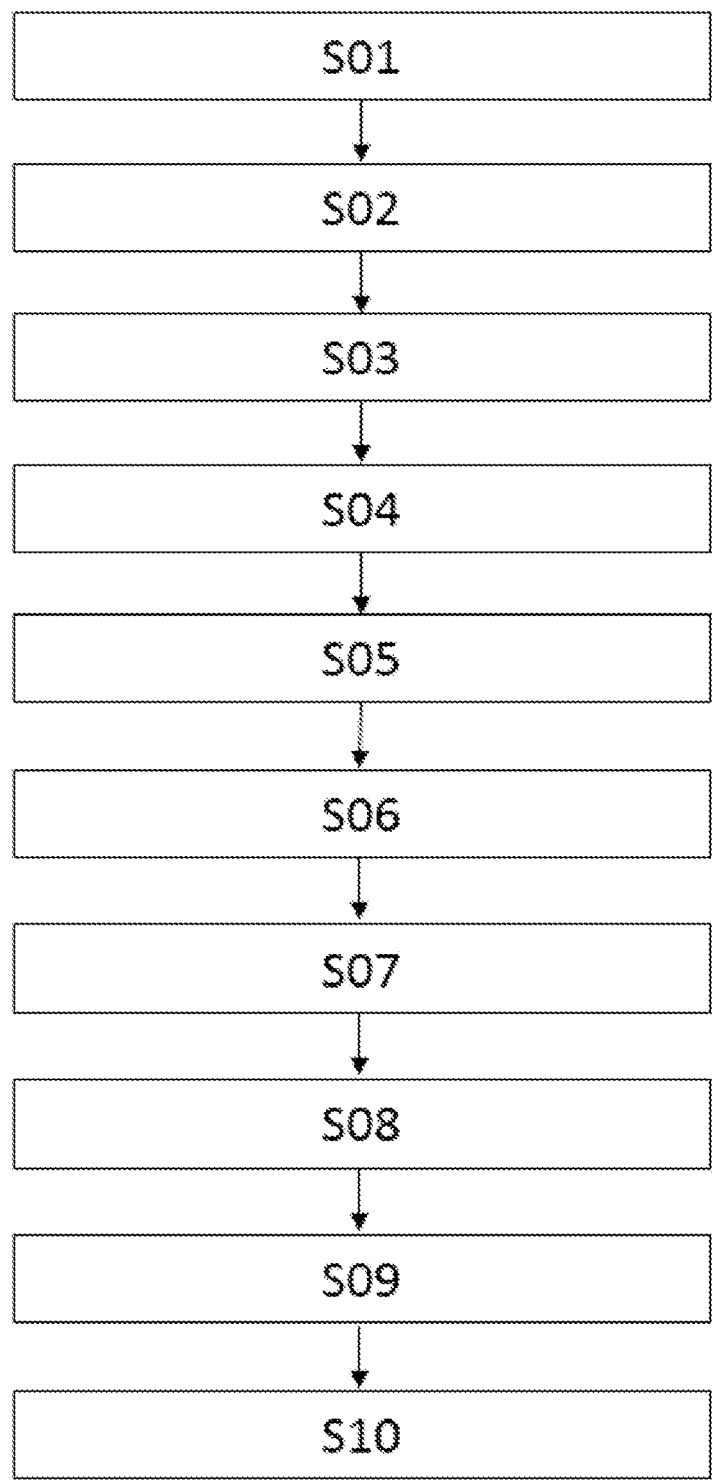
FIG. 1 is a schematic diagram of a process of a method for rapidly estimating for a remaining capacity of the battery according to a first embodiment of the present invention.
Figure 2:
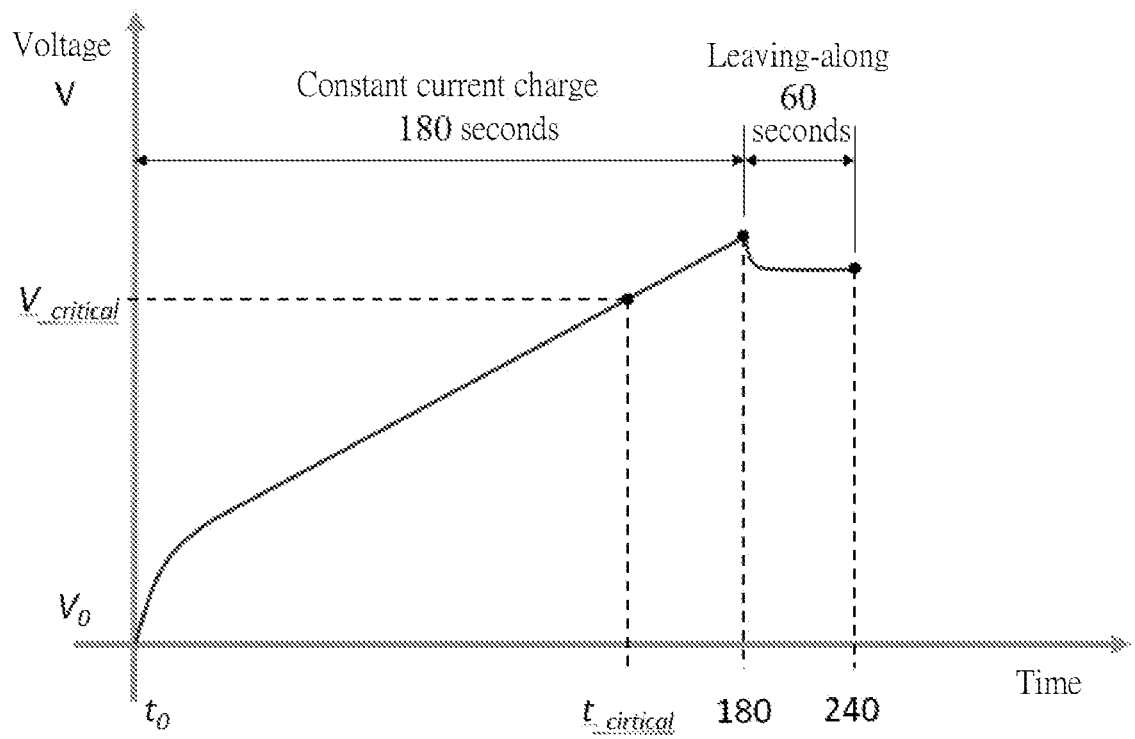
FIG. 2 is a schematic diagram of a voltage-time graph of a method for rapidly estimating for a remaining capacity of the battery according to an embodiment of the present invention.

FIG. 1 is a schematic diagram of a process of a method for rapidly estimating for a remaining capacity of the battery according to a first embodiment of the present invention. As shown in FIG. 1, the embodiment comprises the following steps:

Step01: performing a constant current ($I_{constant}$, may be 0.2 C-2 C) charge to the battery under test in a first period (180-240 seconds), instantly capturing a voltage and a temperature of a positive electrode of the battery under test in a default frequency (≥1 Hz), and generating a voltage-time graph:

An example of the voltage-time graph is shown in FIG. 2, wherein the battery under test is in the environment at temperature of 25±3° C.

Step02: after leaving the battery under test along for a second period, instantly capturing the voltage and the temperature of the positive electrode of the battery under test in the default frequency (≥1 Hz).

Step03: calculating a voltage rising rate of the battery under test during a constant current charging period:

The voltage rise rate $V_{\_rise\ rate}$ is a voltage slew-up rate of the battery under test at the beginning of the constant current charging period (for example, 10 seconds in an embodiment). Please refer to the voltage-time graph shown in FIG. 2, it could find that the voltage of the battery significantly rises at the beginning of charging with the constant current, wherein the $V_{\_rise\ rate}$ of the voltage may be formulated as:

$$V_{\_rise\ rate} = \frac{(V_{10} - V_0)}{(t_{10} - t_0)}$$

Step04: calculating a voltage drop rate of the battery under test during a leaving-along period:

The voltage drop rate $V_{\_drop\ rate}$ is a voltage slew-down rate of the battery under test at the beginning of the leaving-along period (for example, 180-190 seconds after charging finish in an embodiment). Please refer to the voltage-time graph shown in FIG. 2, it could find that the voltage of the battery significant drops at the beginning of charging with the constant current, wherein the $V_{\_drop\ rate}$ of the voltage may be formulated as:

$$V_{\_drop\ rate} = \frac{(V_{180} - V_{190})}{(t_{190} - t_{180})}$$

Step05: calculating a critical sample time:

Firstly, obtaining a standard critical sample time $t_{\_critical\_new}$ of the new battery under test by using the new battery in the environment of 25° C., a fixed 1.0 C constant current ratio, and an initial voltage being the lower bound voltage $V_{\_LL}$. After the processes of charging with the constant current mentioned above, leaving-along, and so on, The embodiment calculates the standard critical sample time $t_{\_critical\_new}$, and according to the different conditions such as type, aging, service time, initial voltage V0, etc. of the battery under test, and chooses the appropriate critical sample time $t_{\_critical}$ of the battery under test. The formula is in the following:

$$\text{service time } ST = \frac{(\text{nowadays} - \text{factory day})}{365}$$

$$\eta = a \cdot \text{service time } ST \cdot \frac{V_{\_drop\ rate}}{V_{\_rise\ rate}}$$

here, a=3.171×10$^{-8}$ and is a constant transfer coefficient.

$$t_{\_critical} = t_{\_critical\_new} - \eta$$

The standard critical sample time $t_{\_critical\_new}$ is determined according to the type of battery. For example, the critical time for new lithium ternary battery may be 124 seconds, and the critical sample time $t_{\_critical}$ may be 110-180 seconds;

Step06: applying the critical sample time, comparing the voltage-time graph calculated in the constant current charging period, to capture a critical sampling voltage:

Please refer to the example of the voltage-time graph shown in FIG. 2. After obtaining the critical sample time $t_{\_critical}$, the critical sampling voltage $V_{\_critical}$ may be calculated from the curve of the voltage-time graph;

Step07: calculating a voltage difference slope of the battery under test:

The formula of the voltage difference slope $S_{\_charging}$ is:

$$S_{\_charging} = \frac{(V_{\_critical} - V_0)}{(t_{\_critical} - t_0)}$$

wherein $V_0$ is the initial voltage, $t_0$ is the initial time;

Step08: calculating a charging time, which is consumed by charging the battery under test from a lower bound voltage to an upper bound voltage with the constant current:

The formula of the charging time $\Delta t$ is:

$$\Delta t = \frac{(V_{\_UL} - V_{\_LL})}{S_{\_charging}}$$

wherein the upper bound voltage of the battery under test is $V_{\_UL}$, the lower bound voltage is $V_{\_LL}$, the State-of-Charge is 100% when the battery under test is on the upper bound voltage, and the battery is 0% when the battery under test is on the lower bound voltage;

Step09: calculating a compensation ratio value on the remaining capacity of the battery under test:

The formula of the compensation ratio value δ is:

$$\delta = \alpha \cdot \frac{(T_{\_ambient} - 25° C.)}{25° C.} + \beta \cdot \frac{(I_{\_constant} - I_{\_1.0C})}{I_{\_1.0C}} + \gamma \cdot \frac{(V_0 - V_{\_rated})}{V_{\_rated}}$$

$$-0.2 < \alpha < 0,\ 0.2 > \beta > 0,\ \text{and } 0.2 > \gamma > 0$$

wherein $T_{\_ambient}$ is the environmental temperature under test, V_rated is a rated voltage of the battery under test (for example, a single lithium-iron battery is 3.2V, lithium ternary battery is 3.7V, a single lead-acid battery is 2.0V, and the nickel-hydrogen battery is 1.2V, etc.);

Step10: calculating the remaining capacity of the battery under test:

The formula of the remaining capacity of battery Capacity$_{\_estimate}$ is:

$$\text{Capacity}_{\_estimate} = I_{\_@1.0\ C} \cdot \Delta t \cdot (1+\delta)/3600$$

The computational process of an embodiment of the present invention is given below to disclose the estimating method of the present invention in detail. In the example, the battery is lithium ternary battery, the rated voltage is 44.4V, the constant current for charging is 94 A, and the environmental temperature is 25° C.:

$$V_{\_rise\ rate} = \frac{(V_{10} - V_0)}{(t_{10} - t_0)} = \frac{(43.0097 - 42.8549)}{(10 - 0)} = 0.01548$$

$$V_{\_drop\ rate} = \frac{(V_{180} - V_{190})}{(t_{190} - t_{180})} = \frac{(43.7349 - 42.9611)}{(190 - 180)} = 0.07708$$

$$\text{service time } ST = \frac{(\text{nowadays} - \text{factory day})}{365} = 5.0$$

$$\eta = a \cdot ST \cdot \frac{V_{\_drop\ rate}}{V_{\_rise\ rate}} = 3.171 \times 10^{-8} \times 5.0 \times \frac{0.07708}{0.01548} = 9.9586 \cong 10$$

$$t_{\_critical} = t_{\_critical\_new} - \eta = 124 - 10 = 114$$

$$S_{\_charging} = \frac{(V_{\_critical} - V_0)}{(t_{\_critical} - t_0)} = \frac{(43.5156 - 42.8549)}{(114 - 0)} = 0.005796$$

$$\Delta t = \frac{(V_{\_UL} - V_{\_LL})}{S_{\_charging}} = \frac{(50.4 - 32.4)}{0.005796} = 3105.59$$

$$\delta = \alpha \cdot \frac{(T_{\_ambient} - 25° C.)}{25° C.} + \beta \cdot \frac{(I_{\_constant} - I_{\_1.0C})}{I_{\_1.0C}} + \gamma \cdot \frac{|V_0 - V_{\_rated}|}{V_{\_rated}} =$$

$$-0.08 \cdot \frac{(25° C. - 25° C.)}{25° C.} + 0.05 \cdot \frac{(94.0 - 94.0)}{94.0} +$$

$$0.01 \cdot \frac{|42.8549 - 44.4|}{44.4} = 0.000348 \text{ here,}$$

$$\alpha = -0.08,\ \beta = 0.05,\ \text{and } \gamma = 0.01$$

$$\text{Capacity}_{\_estimtae} =$$

$$I_{\_@1.0C} \cdot \Delta t \cdot \frac{(1+\delta)}{3600} = 94.0 \times 3105.59 \times \frac{(1 + 0.000348)}{3600} = 81.13\ Ah$$

In an embodiment of the present invention, when the battery is aging and degrading, the critical sample time $t_{\_critical}$ should be chosen the less value. The initial voltage ($V_0$) is preferable to be the voltage when SoC≤90% of the battery under test.

The other 19 embodiments of the present invention are provided, shown in the table in FIG. 3. As can be seen, the estimation of the battery by the method of the present invention is slightly different from the realistic measurement. That is, the method to rapidly estimate for the remaining capacity of the battery of the present invention is accurate, and the measurement time is less than the conventional technique.

Therefore, the present invention provides a method for rapidly estimating for a remaining capacity of a battery, which could fast and accurately calculate the remaining capacity of the battery under test, which can be the basis of battery lifetime estimation and battery usage analysis. Unlike the prior art which has to take at least 2 hours, measuring the battery by the process of charging and discharging of the present invention takes 4 minutes merely. Therefore, the estimation for the remaining capacity of the battery is fast, so as to make the benefits to energy storage, electric vehicles, and other related applications, which apply to the batteries.

The foregoing embodiments are not intended to limit the present application. Those skilled in the art may make modifications and alterations accordingly and not limited herein. Therefore, the scope of the present invention should be as listed in the scope of the claims mentioned below.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for rapidly estimating for a remaining capacity of a battery, comprising:
    performing a constant current charge to the battery under test in a first period, instantly capturing a voltage and a temperature of a positive electrode of the battery under test in a default frequency, and generating a voltage-time graph;
    after leaving the battery under test along for a second period, instantly capturing the voltage and the temperature of the positive electrode of the battery under test in the default frequency;
    calculating a voltage rising rate of the battery under test during a constant current charging period;
    calculating a voltage drop rate of the battery under test during a leaving-along period;
    calculating a critical sample time based on the voltage rising rate and the voltage drop;
    applying the critical sample time, and comparing the voltage-time graph measured in the constant current charging period, to obtain a critical sampling voltage;
    calculating a voltage difference slope of the battery under test;
    calculating a charging time, which is consumed by charging the battery under test from a lower bound voltage to an upper bound voltage with the constant current;
    calculating a compensation ratio value on the remaining capacity of the battery under test; and
    calculating the remaining capacity of the battery under test based on the compensation ratio value.

2. The method for rapidly estimating for a remaining capacity of a battery of claim 1, wherein the first period is 180-240 seconds.

3. The method for rapidly estimating for a remaining capacity of a battery of claim 1, wherein the second period is 30-60 seconds.

4. The method for rapidly estimating for a remaining capacity of a battery of claim 1, wherein the default frequency $\geq 1$ Hz.

5. The method for rapidly estimating for a remaining capacity of a battery of claim 1, wherein the battery under test in an environmental temperature is in a safe temperature of the battery under test.

6. The method for rapidly estimating for a remaining capacity of a battery of claim 1, wherein the constant current for charging is 0.2 C-2 C.

* * * * *